(12) United States Patent
Rabie et al.

(10) Patent No.: US 10,923,397 B2
(45) Date of Patent: Feb. 16, 2021

(54) THROUGH-SUBSTRATE VIA STRUCTURES IN SEMICONDUCTOR DEVICES

(71) Applicant: GLOBALFOUNDRIES INC., Grand Cayman (KY)

(72) Inventors: Mohamed A. Rabie, Clifton Park, NY (US); Md Sayed Kaysar Bin Rahim, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 16/203,619

(22) Filed: Nov. 29, 2018

(65) Prior Publication Data
US 2020/0176312 A1    Jun. 4, 2020

(51) Int. Cl.
| | |
|---|---|
| H01L 21/768 | (2006.01) |
| H01L 21/311 | (2006.01) |
| H01L 23/00 | (2006.01) |
| H01L 23/48 | (2006.01) |

(52) U.S. Cl.
CPC .. *H01L 21/76898* (2013.01); *H01L 21/31138* (2013.01); *H01L 21/31144* (2013.01); *H01L 23/481* (2013.01); *H01L 24/05* (2013.01); *H01L 2224/0231* (2013.01); *H01L 2224/0235* (2013.01); *H01L 2224/02372* (2013.01); *H01L 2224/02381* (2013.01); *H01L 2224/0557* (2013.01)

(58) Field of Classification Search
CPC ......... H01L 21/76804; H01L 21/76898; H01L 23/481; H01L 2225/06541
See application file for complete search history.

(56) References Cited

U.S. PATENT DOCUMENTS

| | | | |
|---|---|---|---|
| 6,417,094 B1 * | 7/2002 | Zhao | ................. H01L 21/76808 257/E21.579 |
| 7,564,115 B2 | 7/2009 | Chen et al. | |
| 7,863,721 B2 | 1/2011 | Suthiwongsunthorn et al. | |
| 8,193,615 B2 | 6/2012 | Haba et al. | |
| 8,384,225 B2 | 2/2013 | Rahman et al. | |
| 2006/0060975 A1 * | 3/2006 | Usami | ............... H01L 21/76804 257/762 |
| 2008/0265442 A1 * | 10/2008 | Yagi | ................. H01L 21/76804 257/786 |

(Continued)

FOREIGN PATENT DOCUMENTS

| | | |
|---|---|---|
| CN | 102337541 A | 9/2011 |
| KR | 101513381 B1 | 10/2011 |

*Primary Examiner* — David C Spalla
(74) *Attorney, Agent, or Firm* — David Cain

(57) ABSTRACT

A semiconductor device is provided that includes a substrate, an integrated circuit with a conductive member and a through-substrate-via (TSV) structure. The substrate includes a front surface and a back surface that is opposite the front surface. The integrated circuit with the conductive member is formed over the front surface of the substrate. The TSV structure having vertical sidewalls is formed in the back surface of the substrate connecting with the conductive member. The TSV structure includes a tapered first insulation layer, a conformal conductive layer and a second insulation layer, with the conformal conductive layer positioned between the first and second insulation layers. The conformal conductive layer is electrically connected to the conductive member.

20 Claims, 6 Drawing Sheets

(56) References Cited

U.S. PATENT DOCUMENTS

| | | |
|---|---|---|
| 2009/0309235 A1* | 12/2009 | Suthiwongsunthorn ..................... H01L 24/17 257/777 |
| 2010/0013060 A1 | 1/2010 | Lamy et al. |
| 2011/0237073 A1 | 9/2011 | Dao et al. |
| 2011/0304026 A1 | 12/2011 | Tsui et al. |
| 2013/0193585 A1 | 8/2013 | Lin et al. |
| 2013/0234341 A1* | 9/2013 | Onai ................. H01L 21/76898 257/774 |
| 2014/0117556 A1* | 5/2014 | Lin ....................... H01L 21/486 257/774 |
| 2015/0228555 A1 | 8/2015 | Rabie et al. |
| 2016/0351521 A1* | 12/2016 | Kume ..................... H01L 24/13 |
| 2017/0154850 A1* | 6/2017 | Kao .................... H01L 23/3171 |

* cited by examiner

THROUGH-SUBSTRATE VIA STRUCTURES IN SEMICONDUCTOR DEVICES

FIELD OF THE INVENTION

The presently disclosed subject matter relates generally to structures in semiconductor devices, and more particularly to through-substrate via structures in semiconductor devices and their method of fabrication.

BACKGROUND

Vias are commonly used structures in integrated circuit (IC) devices. Vias may be formed on a front side, i.e., the active side, of the IC to form electrical connections between various conducting layers in the back-end-of-line (BEOL) structure of the IC. Vias may also be formed in a back surface of the IC that extend to the front side and such vias are often referred to as "through-substrate vias" (TSVs). TSVs are used to form electrical connections through the back surface of the IC; for example, wafer to wafer bonding or fabrication of three-dimensional (3D) ICs.

The aspect ratio of a via can be defined as a ratio of the via's depth (or height) to the via's width (or diameter). The typical TSV has a relatively high aspect ratio due to the thickness of the semiconductor substrate used to fabricate the IC. When using conventional processes, such as sputtering or electroplating processes to deposit conductive materials, the TSVs having substantially vertical sidewalls are difficult to fill. The challenges may include poor sidewall coverage, improper seed layer formation, and/or voids formation during the process of filling the via with conductive material.

The aspect ratio of a via can be decreased by decreasing the depth of the via and/or increasing the width of the via. However, the depth of a TSV is often limited by the thickness of the semiconductor substrate or by the extent to which the substrate's back surface can be thinned. Also, decreasing the aspect ratio of the via by increasing the via's width can be limited by the available "real estate" on the substrate.

Additionally, the typical TSV structure is especially inadequate for radio frequency (RF) applications transmitting high power RF signals through the TSV. A RF switch is required to handle high speed switching of high power RF signals, and presence of parasitic components, such as parasitic inductance, capacitance, conductance and resistance, may combine to attenuate and degrade the RF signal considerably that the switch is being use to route. RF signal losses is more significant at higher operating frequency, and it is critical to ensure the signal losses is kept low, or at least at an acceptable level for a specific application.

As described above, there is a strong need to identify an improved TSV structure that can overcome the above fabrication challenges and provide a good optimization between low cost manufacturability and minimal RF signal losses.

SUMMARY

To achieve the foregoing and other aspects of the present disclosure, a TSV structure with a tapered conductive layer and a method of fabricating the same are presented.

According to an aspect of the present disclosure, a semiconductor device is provided that includes a substrate, a conductive member, a through-substrate via (TSV), a tapered conductive layer. The substrate includes a front surface and a back surface that is opposite the front surface. The conductive member is formed over the front surface of the substrate. The TSV is filled with an insulation material and the tapered conductive layer is formed in the TSV, wherein the conductive layer is positioned between the insulation materials and is electrically connected to the conductive member.

According to another aspect of the present disclosure, a method of fabricating a semiconductor device is provided that includes providing a substrate having a front surface and a back surface. An integrated circuit is formed over the front surface of the substrate, and the integrated circuit includes a conductive member. A TSV opening is formed from the back surface of the substrate, through the substrate to expose the conductive member. An insulation material is filled in the TSV opening to form a TSV. A tapered opening is formed in the TSV and a conductive layer is deposited in the opening, wherein the conductive layer is electrically connected to the conductive member.

BRIEF DESCRIPTION OF THE DRAWINGS

The embodiments of the present disclosure will be better understood from a reading of the following detailed description, taken in conjunction with the accompanying drawings.

Figure 1A:
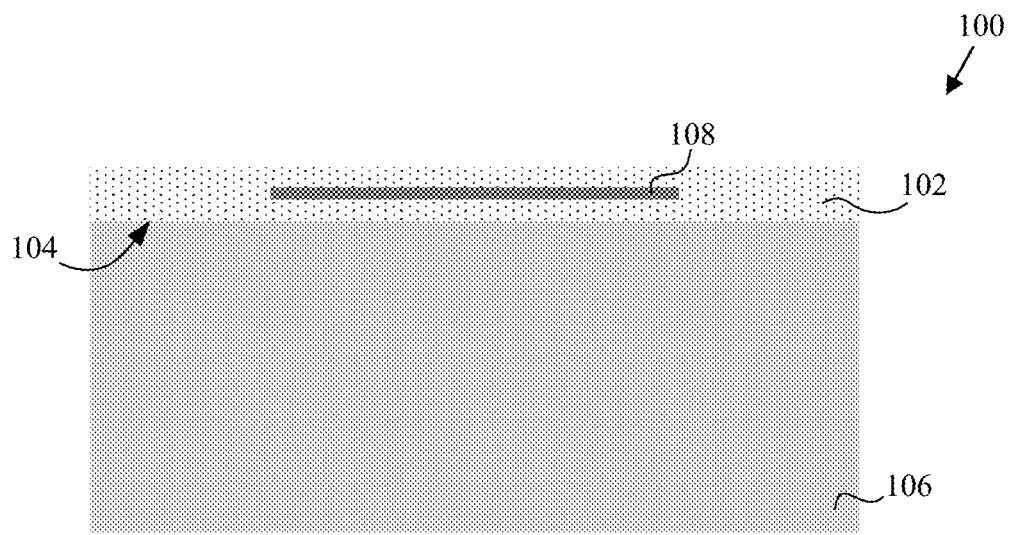
FIGS. 1A-1K are cross-sectional views of a semiconductor device illustrating a method of fabricating a TSV structure, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the disclosure. Additionally, elements in the drawings are not necessarily drawn to scale. For example, the dimensions of some of the elements in the drawings may be exaggerated relative to other elements to help improve understanding of embodiments of the disclosure. The same reference numerals in different drawings denote the same elements, while similar reference numerals may, but do not necessarily, denote similar elements.

DETAILED DESCRIPTION

The following detailed description is exemplary in nature and is not intended to limit the device or the application and uses of the device. Furthermore, there is no intention to be bound by any theory presented in the preceding background of the device or the following detailed description.

In order to improve the reliability and performance of a TSV on a semiconductor device, a TSV structure with a tapered conductive layer and a method of fabricating the same is presented. Aspects of the present disclosure are now described in detail with accompanying drawings. It is noted that like and corresponding elements are referred to by the use of the same reference numerals.

FIG. 1A is a cross-sectional view of the semiconductor device 100 having an integrated circuit (IC) 102, including front-end-of-line (FEOL) active devices and back-end-of-line (BEOL) interconnect structures, formed on a front surface 104 of a semiconductor substrate 106. The FEOL active devices, such as transistors, capacitors and resistors, are formed using conventional FEOL fabrication techniques known to those of ordinary skill in the art and are not shown for simplicity and clarity.

As illustrated in this embodiment shown in FIG. 1A, the conductive line 108 is a conductive line at a first conductive level. The conductive line 108 may be made of a conductive material; for example, aluminum (Al) or copper (Cu), or other suitable conductive materials. It should be understood that, for simplicity, only one conductive line 108 is shown in FIG. 1A, and there are other conductive lines, vias and other elements, such as metal-insulator-metal (MIM) structures, in the BEOL portion of the IC 102. These BEOL interconnect structures are formed using conventional BEOL fabrication techniques.

The semiconductor substrate 106 may include of any appropriate semiconductor material, such as silicon, silicon/germanium, silicon/carbon, other II-VI or III-V semiconductor compounds and the like. Thus, the terms "substrate" or "semiconductor substrate" should be understood to cover all typically used semiconducting materials and all forms of such materials.

Figure 1B:
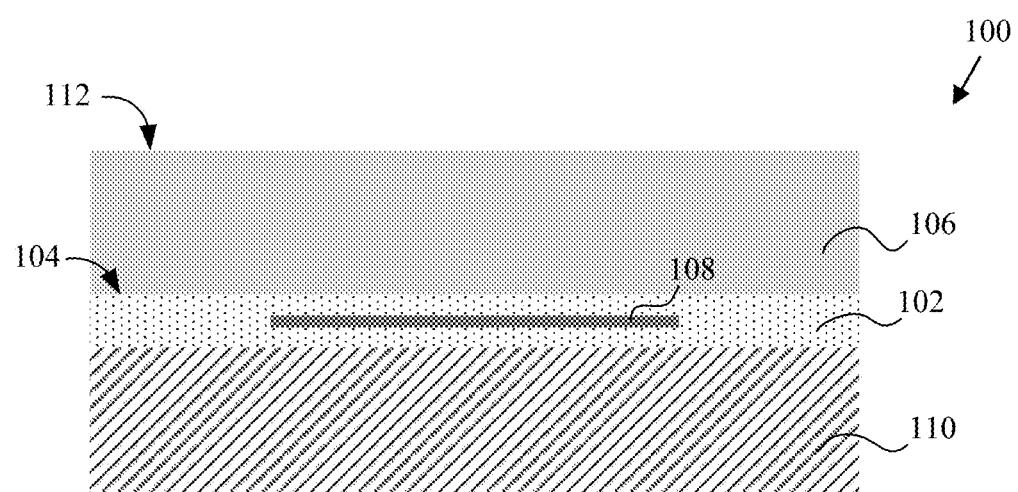

FIG. 1B is a cross-sectional view of the semiconductor device 100 after a substrate thinning process. A carrier 110 is attached to the IC 102 of the semiconductor device 100 to hold the semiconductor device 100 in place and to protect the IC 102 during the substrate thinning process. As illustrated in FIG. 1B, the carrier 110 is a layer of glass. Other suitable carrier materials, such as protective tapes, may also be used. The semiconductor device 100 is flipped, with the back surface 112 of the semiconductor substrate 106 facing upwards for subsequent fabrication steps.

The substrate thinning process is often referred to as "backgrinding", as it is conventionally accomplished by mechanically grinding a back surface 112 of the semiconductor substrate 106. Other suitable substrate thinning process may also be employed; for example, chemical-mechanical planarization (CMP), plasma etching or wet etching. The term "back surface" used herein refers to a surface opposite the front surface of the semiconductor substrate at which the IC portion is fabricated. The semiconductor substrate 106 is thinned to a required thickness, depending on the application.

In one embodiment of the disclosure, the semiconductor substrate 106 has a thickness in a range of 20 to 100 um after the substrate thinning process. In another embodiment of the disclosure, the semiconductor substrate 106 has a preferable thickness of 50 um after the substrate thinning process.

Figure 1C:
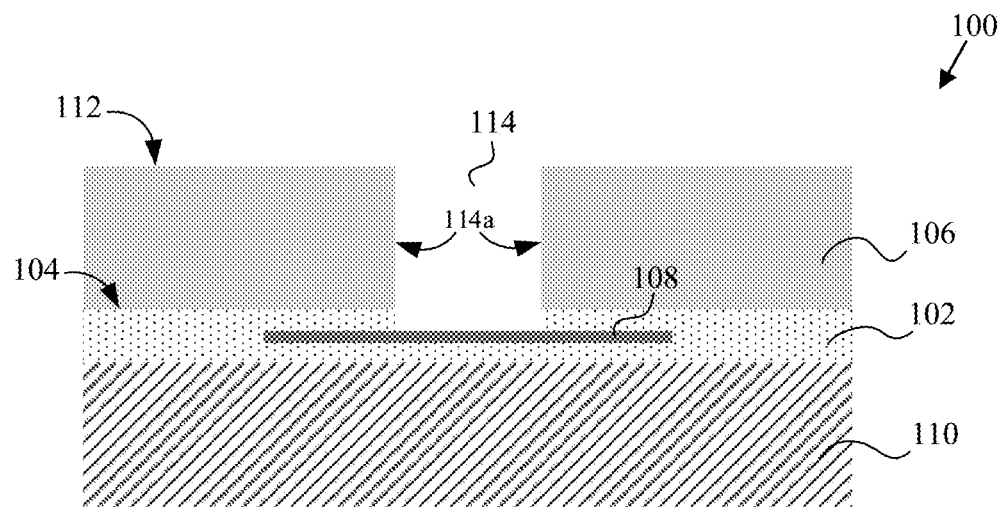

FIG. 1C is a cross-sectional view of the semiconductor device 100 after forming a TSV opening 114 from the back surface 112 of the semiconductor substrate 106, extending through the semiconductor substrate 106 to expose the conductive line 108. The TSV opening 114 is formed using suitable photolithographic and etching processes. Although FIG. 1C illustrates the TSV opening 114 having vertical and chamferless sidewalls 114a, alternative embodiments of the TSV opening 114 may not be exactly vertical and chamferless. In one embodiment of the disclosure, the TSV opening 114 has a minimum width of 50 um.

Figure 1D:
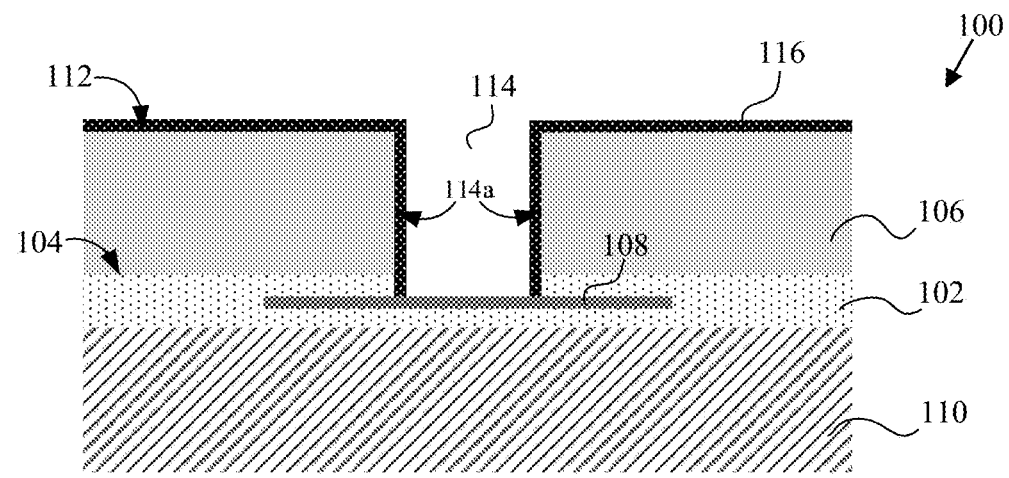

FIG. 1D is a cross-sectional view of the semiconductor device 100 after selectively removing a dielectric layer 116 over the conductive line 108. First, the dielectric layer 116 is conformally deposited over the semiconductor substrate 106 and in the TSV opening 114 and, thereafter, is selectively removed from the TSV opening 114, using suitable photolithographic and etching processes, to expose the conductive line 108. The dielectric layer 116 acts as an insulator and may include a combination of one or more layers of an oxide and/or a polymer material. In one embodiment of the disclosure, the dielectric layer 116 is deposited using conventional plasma-enhanced chemical vapor deposition (PECVD) and has a preferable thickness from 0.1 to 0.5 um.

Figure 1E:
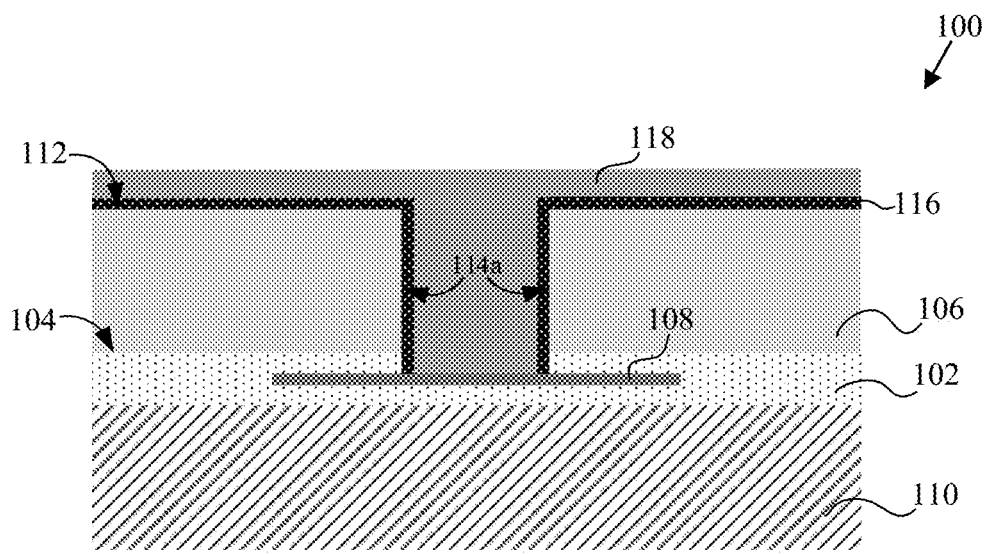

FIG. 1E is a cross-sectional view of the semiconductor device 100 after depositing an insulating layer 118. The insulating layer 118 is deposited over the dielectric layer 116 and filling the TSV opening 114 in the substrate 106. The insulating layer 118 may be deposited either using spin coating technique or dry film vacuum lamination process.

In one embodiment of the disclosure, the insulating layer 118 may be made of an insulation material, such as polyimide. Polyimide has several desirable properties, such as ease of deposition, flexibility in composition, good planarity as a spun film, good temperature tolerances, and having a low dielectric constant. The polyimide film is preferred to be fully heat cured after depositing over the dielectric layer 116.

Figure 1F:
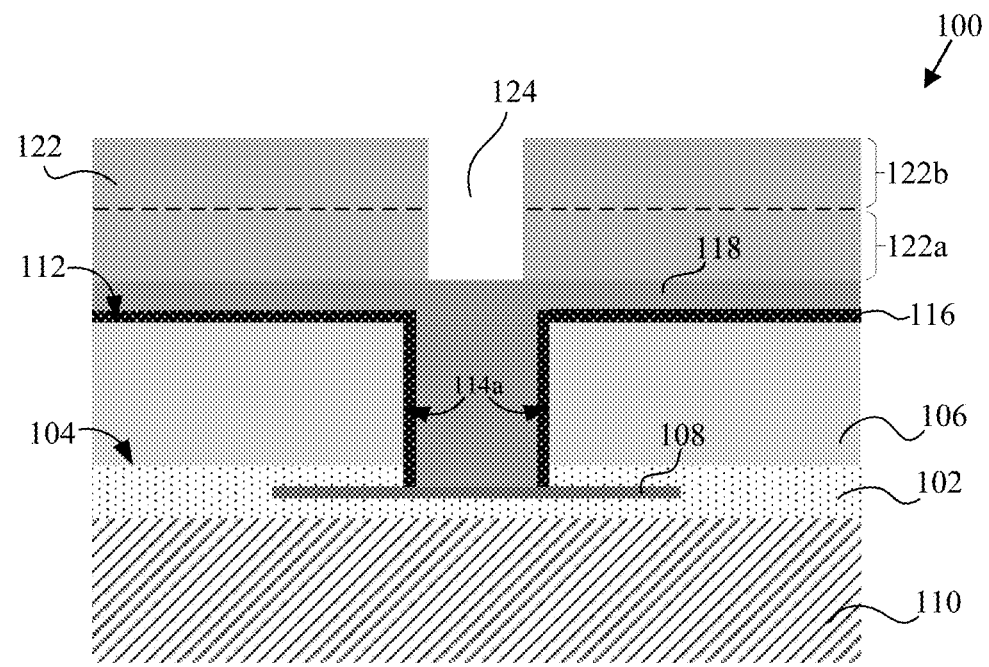

FIG. 1F is a cross-sectional view of the semiconductor device 100 after depositing a layer of photoresist 122 over the insulating layer 118 and forming an opening 124 in the photoresist 122. As it is an objective of this disclosure to protect the insulating layer 118, the photoresist 122 is preferred to have a sufficient thickness that enables a subsequent process step to remove a portion of the insulation material in the TSV opening 114 in the substrate 106 without damaging the insulating layer 118. In one embodiment of the disclosure, the layer of photoresist 122 has a preferred thickness of 40 um.

In order to minimize inhomogeneity of the deposited photoresist 122, such as presence of particles or bubbles, the layer of photoresist 122 is preferably deposited in at least two deposition steps. In one embodiment of the disclosure, the photoresist 122 is deposited in two steps, a first deposition step to deposit a first portion 122a of the layer of photoresist 122 and a second deposition step to deposit a second portion 122b of the layer of photoresist 122. The first portion of the photoresist 122a is spin-coated over the insulating layer 118, followed by a first soft bake process to evaporate solvents and solidify the photoresist 122a to ensure structural stability for another round of spin coating. The second portion of the photoresist 122b is then spin-coated over the first portion 122a, followed by a second soft bake process. The first soft bake process ensures a homogenous drying of the first portion of the photoresist 122a. If there are remaining solvents present in the first portion of the photoresist 122a during the spin-coating of the second portion 122b, the second portion of the photoresist 122b may partially or completely dissolve the first layer 122a, causing inhomogeneity in the layer of photoresist 122.

The opening 124 is formed in the layer of photoresist 122 using conventional photolithographic process and may have a same width or a smaller width as the TSV opening 114. In one embodiment of the disclosure, the opening 124 in the layer of photoresist 122 is smaller than the width of the TSV opening 114.

Figure 1G:
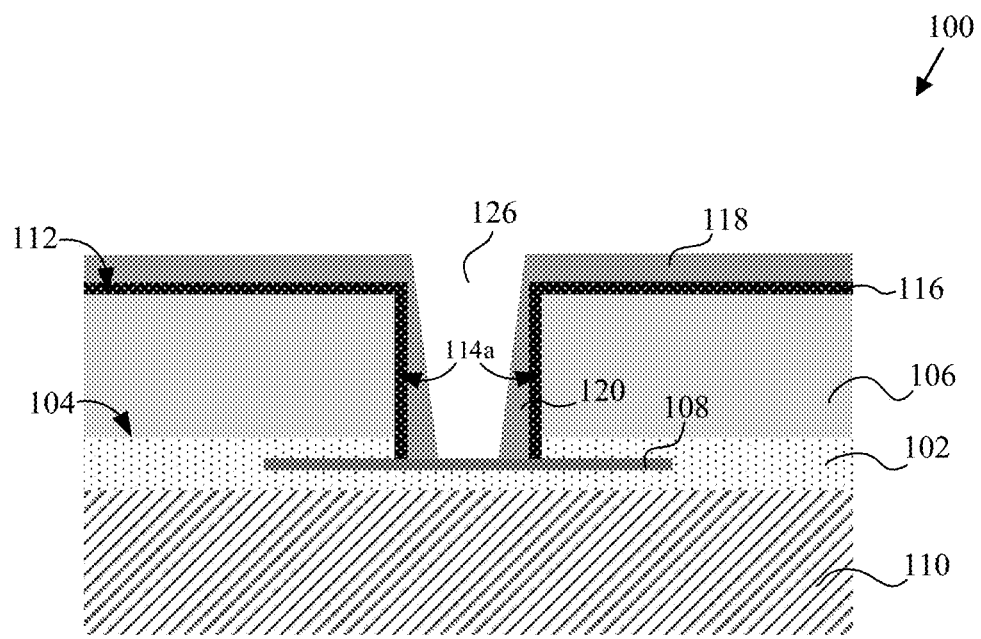

FIG. 1G is a cross-sectional view of the semiconductor device 100 after forming a tapered opening 126 having TSV sidewall 120. The tapered opening 126 is formed using plasma etching process. The tapered opening 126 exposes a portion of the conductive line 108. The tapered opening 126 is tapered in a direction such that the tapered opening 126 has an increasing diameter with increasing distance from the front surface 104 of the substrate, i.e., the TSV sidewall 120 having a decreasing width with increasing distance from the front surface 104 of the substrate 106, forming a conical frustum shape. The width of the tapered opening 126 is largest proximal to the back surface 112 of the substrate 106. In one embodiment of the disclosure, the tapered opening 126 has a width in a range of 3 to 25 um proximal to the front surface 104 of the substrate 106. In another embodiment of the disclosure, the tapered opening 126 has a width in a range of 20 to 50 um proximal to the back surface 112 of the substrate 106.

Etching chemistry used to form the tapered opening 126 may include using following conditions: tetrafluoromethane ($CF_4$) gas with a gas flow rate of approximately 58 sccm. The radio frequency (RF) power applied is approximately 400 W at a pressure of approximately 140 mTorr. Etching duration may last for approximately 5 to 10 minutes to form the tapered opening 126 having a depth of approximately 50 um. After the tapered opening 126 is formed, a plasma clearing process is performed to remove residual contaminants from the plasma etching process. The plasma chemistry may include using oxygen-based plasma at a flow rate of approximately 14 sccm. The above process conditions serve only as a general guideline to those skilled in the art, and may require further process optimization to achieve a tapered opening.

As it is an objective to protect the insulating layer 118 from the plasma etching process, the presence of photoresist 122 remaining over the insulating layer 118 may be expected and the photoresist 122 may be removed using a suitable wet strip process after the formation of the tapered opening 126 and the TSV sidewall 120.

Figure 1H:
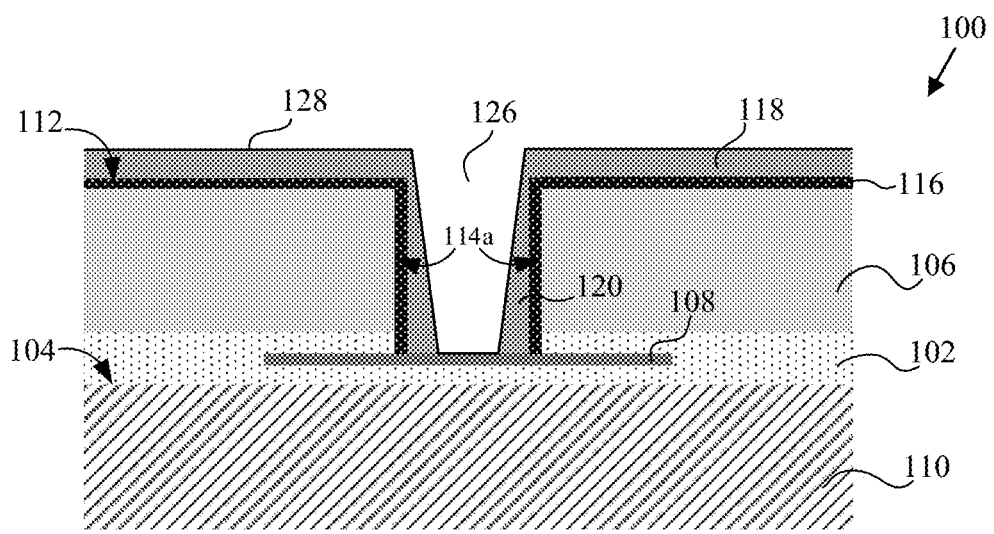

FIG. 1H is a cross-sectional view of the semiconductor device 100 after conformally depositing a seed layer 128 over the insulating layer 118 and over the exposed portion of the conductive line 108. The seed layer 128 forms a conductive base, or "seed", for subsequent deposition of conductive material. The seed layer 128 may also function as a diffusion barrier layer or an adhesion layer for the conductive material. In one embodiment of the disclosure, the seed layer 128 includes a bilayer of titanium nitride and copper (TiN/Cu) or tantalum nitride and copper (TaN/Cu).

The seed layer 128 is deposited using a suitable deposition process; for example, physical vapor deposition (PVD) process, derivatives of PVD process or sputtering. As the tapered opening 126 has a conical frustum shape, the seed layer 128 can be deposited with good coverage on the TSV sidewall 120, which may be challenging for an opening with a high aspect ratio and substantially vertical sidewalls.

Figure 1I:
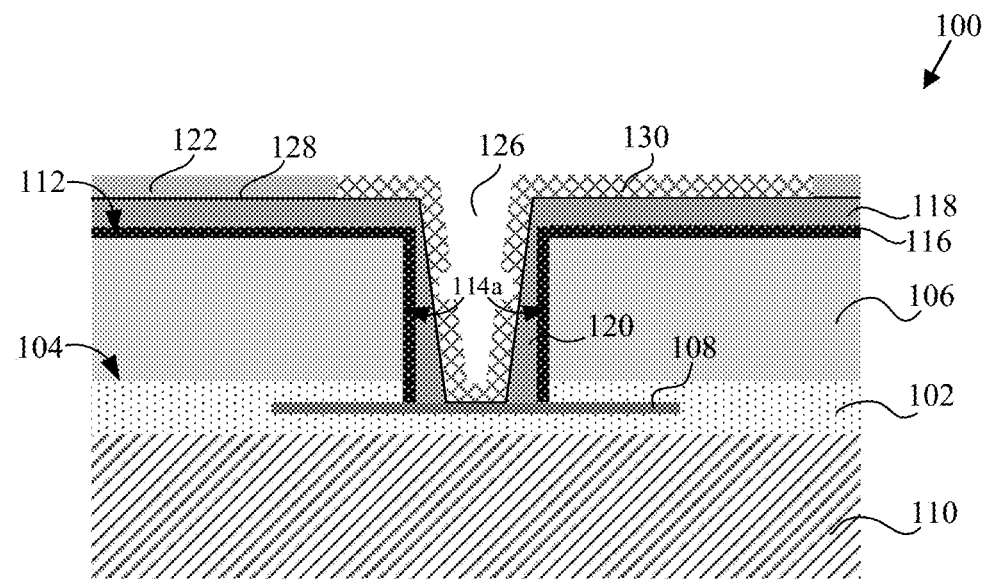

FIG. 1I is a cross-sectional view of the semiconductor device 100 after forming a conductive layer 130. The conductive layer 130 is a part of a redistribution layer (RDL) to route electrical signals to various areas of the semiconductor device 100 and provides various electrical interconnection options during package integration.

The placement of the conductive layer 130 is defined using a layer of photoresist 122 deposited over the seed layer 128 and an opening formed is using conventional photolithographic process to expose a portion of the seed layer 128. A conductive material is deposited conformally on the exposed seed layer 128 and is electrically connected to the conductive line 108. The conductive layer 130 may be formed using electro-chemical plating (ECP), electro-less plating, or other suitable deposition methods. In an embodiment of the disclosure, the conductive layer 130 has a thickness in a range of 3 to 10 um, with a preferred thickness of 5 um. In another embodiment of the disclosure, the conductive material is Cu or alloys of Cu, although other conductive materials, such as Al, gold (Au), silver (Ag), or combinations thereof, may be used.

As a result of the tapered opening 126 having a conical frustum-shape, the thickness of the insulating layer forming TSV sidewall 120 between the conductive layer 130 and the semiconductor substrate 106 proximal to the front surface 104 of the semiconductor substrate 106 is thicker than its thickness between the conductive layer 130 and the semiconductor substrate 106 proximal to the back surface 112 of the semiconductor substrate 106. The conductive layer 130 deposited on the TSV sidewall 120 is, thus, further isolated from the FEOL active devices of IC 102, and the resulting capacitance is significantly reduced in the region proximal to the front surface 104 of the semiconductor substrate 106.

This significant reduction in capacitance is especially advantageous for RF applications. As a result of the significant reduction in capacitance in the region proximal to the FEOL active devices of the IC 102, signal losses can therefore be kept low for RF applications. More specifically, the reduction in insertion loss is more significant than the corresponding reduction in return loss for an RF device.

In addition, the potential mechanical stress resulting from the mismatch of thermal expansion coefficients between the conductive layer 130 and the semiconductor substrate 106 is also significantly buffered due to the thicker ductile isolation buffer from the insulating layer of TSV sidewall 120 near to the IC 102 of the semiconductor device 100.

Figure 1J:
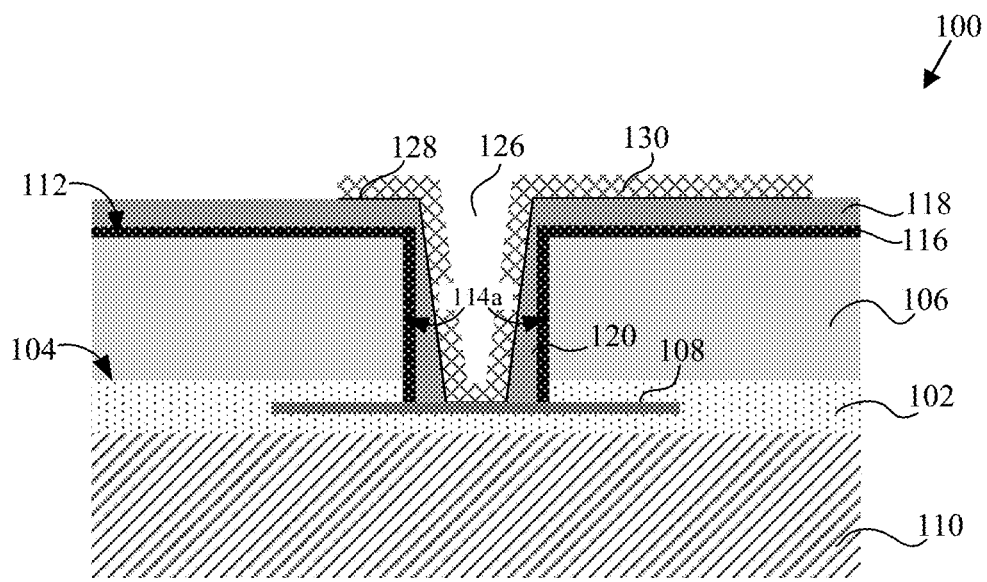

FIG. 1J is a cross-sectional view of the semiconductor device 100 after selectively removing the photoresist 122 and the seed layer 128. The photoresist 122 is removed using a suitable etching process, such as wet strip, after the conductive layer 130 is deposited and a portion of the seed layer 128 is exposed. The exposed portion of the seed layer 128 is removed using a suitable etching process.

Figure 1K:
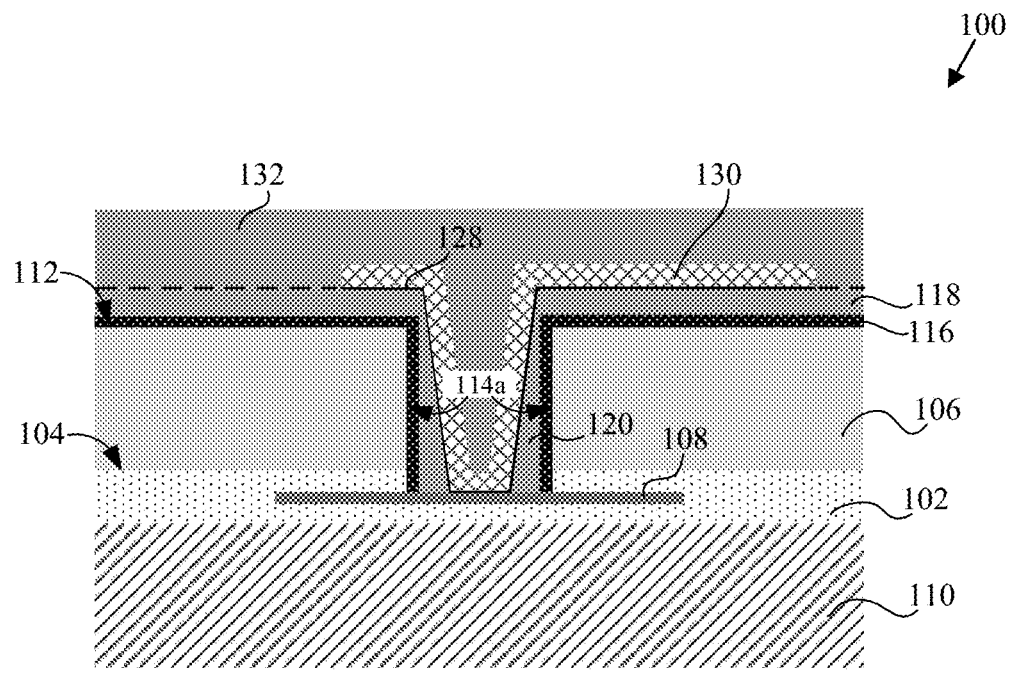

FIG. 1K is a cross-sectional view of the semiconductor device 100 after depositing a passivation layer 132. The passivation layer 132 is deposited over the insulating layer 118 and the conductive layer 130 to provide electrical isolation and physical protection for the semiconductor device 100 and the conductive layer 130. As illustrated in FIG. 1K, the deposited passivation layer 132 fills the tapered opening 126 in the TSV sidewall 120. However, the tapered opening 126 may or may not be fully filled with the passivation material, depending on the application of the TSV. Conductive elements, i.e., the seed layer 128 and the conductive layer 130, of the TSV have to be electrically isolated from the semiconductor substrate 106 to prevent undesirable shortage of electrical pathways.

In one embodiment of the disclosure, the passivation layer 132 may or may not be the same material as the insulating layer 118. In another embodiment of the disclosure, the passivation layer 132 includes an insulation material such as polyimide, benzocyclobutene (BCB), epoxy-based insulating polymer or other insulating polymer materials. In yet another embodiment of the disclosure, the preferred passivation material is polyimide.

In order to connect the semiconductor device 100 to other semiconductor devices or packaging, such as printed circuit board (PCB), openings in the passivation layer 132 can be formed using suitable photolithographic and etching processes to expose a portion the conductive layer 130.

Figure 2:
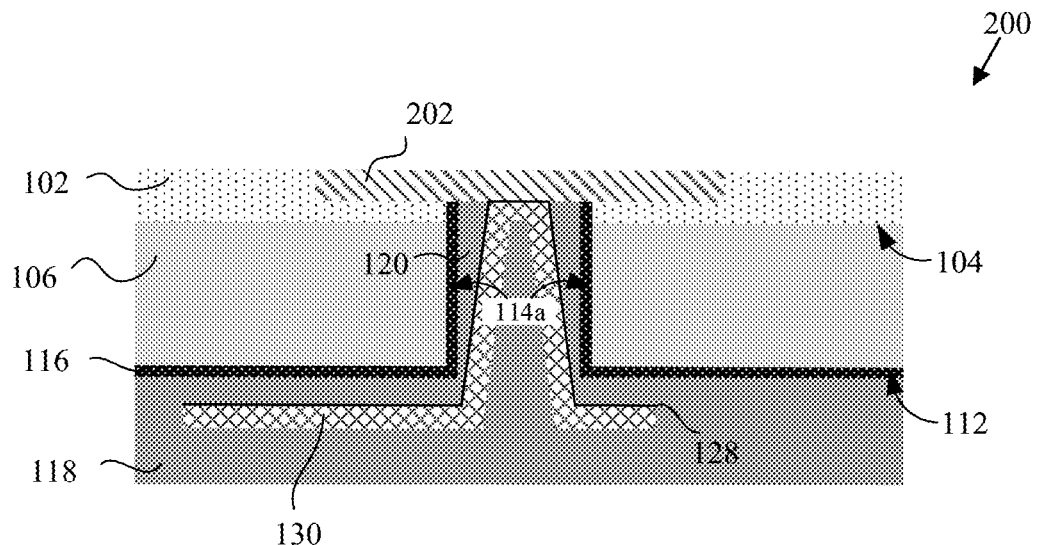
FIG. 2 is a cross-sectional view of a semiconductor device illustrating another embodiment of the disclosure.

FIG. 2 is a cross-sectional view of a semiconductor device 200, according to another embodiment of the disclosure. As illustrated, FIG. 2 includes a bond pad 202 formed at the BEOL portion of the IC 102. The TSV opening 114 having TSV sidewall 120 is formed from the back surface 112 of the semiconductor substrate 106 through the semiconductor substrate 106 to the bond pad 202. The conductive layer 130 is formed conformally over the TSV sidewall 120. It should be understood, for simplicity, other elements in the BEOL portion of the IC 102; such as conductive lines and vias, are not shown.

In the above detailed description, a semiconductor device having a TSV structure with a tapered conductive layer and a method of fabricating the same is presented. A TSV opening is formed from a back surface of a semiconductor substrate, extending through the semiconductor substrate to expose a conductive element; such as a conductive line or a bond pad. The TSV opening is filled with an isolation material. A tapered opening having a conical frustum shape is formed in the TSV opening. The conical frustum-shaped opening facilitates the deposition of a seed layer in the TSV opening. A conductive layer is deposited conformally on the seed layer and is electrically connected to the conductive element, and provides various electrical interconnection options during package integration. As the thickness of the insulation material between the conductive layer and the semiconductor substrate is greatest nearer to the front surface of the semiconductor substrate, the capacitance in the region is significantly reduced and any potential mechanical stress resulting from mismatch of thermal expansion coefficients between the conductive layer and the semiconductor substrate is also buffered by the thicker insulation material.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A semiconductor device comprising:
   a substrate having a front surface and a back surface opposite the front surface;
   an integrated circuit having a conductive member over the front surface of the substrate; and
   a through-substrate via (TSV) structure having vertical sidewalls formed in the back surface of the substrate and connected to the conductive member, wherein the TSV structure has therein a tapered first insulating layer extending from the back surface of the substrate to the conductive member, a conformal conductive layer and a second insulating layer, such that the conformal conductive layer is positioned between the first and second insulating layers and is electrically connected to the conductive member.

2. The semiconductor device of claim 1 further comprises:
   a dielectric layer on the vertical sidewalls and over the back surface of the substrate;
   wherein the tapered first insulating layer is over the dielectric layer, and the dielectric layer and the tapered first insulating layer isolate the conformal conductive layer from the substrate.

3. The semiconductor device of claim 1 wherein the conformal conductive layer has a conical frustum-shape with an upper portion proximal to the back surface of the substrate and a lower portion proximal to the conductive member, such that the upper portion of the conformal conductive layer has a diameter wider than the diameter of the lower portion of the conformal conductive layer.

4. The semiconductor device of claim 1 wherein the conformal conductive layer has a thickness ranging from 3 to 10 um.

5. The semiconductor device of claim 3, wherein the conical frustum-shaped conformal conductive layer increases in diameter with increasing distance from the front surface of the substrate.

6. The semiconductor device of claim 3, wherein the lower portion of the conformal conductive layer proximal to the front surface of the substrate has an outer diameter ranging from 3 to 25 um.

7. The semiconductor device of claim 3, wherein the upper portion of the conformal conductive layer proximal to the back surface of the substrate has an outer diameter ranging from 20 to 50 um.

8. The semiconductor device of claim 1, wherein the conformal conductive layer comprises copper.

9. The semiconductor device of claim 1, wherein the conductive member is a conductive line or a bond pad.

10. The semiconductor device of claim 1, wherein the TSV structure has a minimum width of 50 um.

11. The semiconductor device of claim 1, wherein the tapered first insulating layer comprises polyimide.

12. The semiconductor device of claim 1, further comprises a seed layer positioned between the first insulating layer and the conformal conductive layer.

13. The semiconductor device of claim 12, wherein the seed layer comprises a bilayer of titanium nitride and copper or tantalum nitride and copper.

14. The semiconductor device of claim 1, wherein the tapered first insulating layer extends over the back surface of the substrate.

15. A method of fabricating a semiconductor device comprising:
    providing a substrate having a front surface and a back surface;
    forming an integrated circuit over the front surface of the substrate, wherein the integrated circuit comprises a conductive member;

forming a through-substrate via (TSV) opening having vertical sidewalls from the back surface of the substrate through the substrate to expose the conductive member;

depositing a layer of insulation material to at least completely fill the TSV opening;

forming an opening in the layer of insulation material to form a tapered insulating layer extending from the back surface of the substrate to the conductive member; and forming a conductive layer in the opening, wherein the conductive layer is electrically connected to the conductive member.

16. The method of claim 15, wherein forming the opening in the layer of insulation material, further comprises:

using tetrafluoromethane ($CF_4$) gas plasma etching process to form the opening having a conical frustum-shape.

17. The method of claim 15, wherein the formed opening has a conical-frustum shape with an upper portion proximal to the back surface of the substrate and a lower portion proximal to the conductive member, such that the upper portion of the opening has a diameter wider than the diameter of the lower portion of the opening.

18. A method of fabricating a semiconductor device comprising:

providing a substrate having a front surface and a back surface opposite the front surface;

forming an integrated circuit having a conductive member over the front surface of the substrate;

forming a through-substrate via (TSV) opening having vertical sidewalls extending from the back surface of the substrate to the conductive member;

forming a tapered insulating layer extending from the back surface of the substrate to the conductive member; and forming a conductive layer over the tapered insulating layer, wherein the conductive layer is electrically connected to the conductive member.

19. The method of claim 18, wherein forming of the tapered insulating layer, further comprises:

forming a layer of insulation material over the back surface of the substrate to at least completely fill the TSV opening; and forming an opening in the layer of insulation material to form the tapered insulating layer extending from the back surface of the substrate to the conductive member.

20. The method of claim 19, wherein the opening has a conical frustum shape.

* * * * *